(12) United States Patent
Nakamura et al.

(10) Patent No.: US 9,299,908 B2
(45) Date of Patent: Mar. 29, 2016

(54) PIEZOELECTRIC ACTUATOR AND DRIVE DEVICE

(71) Applicant: MURATA MANUFACTURING CO., LTD., Nagaokakyo-Shi, Kyoto-fu (JP)

(72) Inventors: Kimitoshi Nakamura, Nagaokakyo (JP); Hiroshi Nakatani, Nagaokakyo (JP); Masanaga Nishikawa, Nagaokakyo (JP); Sachio Kitagawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 748 days.

(21) Appl. No.: 13/675,415

(22) Filed: Nov. 13, 2012

(65) Prior Publication Data

US 2013/0069490 A1    Mar. 21, 2013

Related U.S. Application Data

(63) Continuation of application No. PCT/JP2011/060427, filed on Apr. 28, 2011.

(30) Foreign Application Priority Data

May 17, 2010    (JP) ................................. 2010-113319

(51) Int. Cl.
*H01L 41/00* (2013.01)
*H01L 41/047* (2006.01)
*G11B 5/48* (2006.01)
*H01L 41/09* (2006.01)

(52) U.S. Cl.
CPC ............ *H01L 41/0472* (2013.01); *G11B 5/483* (2015.09); *G11B 5/4813* (2013.01); *G11B 5/4873* (2013.01); *H01L 41/047* (2013.01); *H01L 41/0477* (2013.01); *H01L 41/0986* (2013.01)

(58) Field of Classification Search
CPC .... G11B 5/4813; G11B 5/482; G11B 5/4873; H01L 41/047; H01L 41/0472; H01L 41/0986
USPC .......................... 310/359, 366, 368, 364, 363
IPC ................ H01L 41/00, 41/047, 41/083, 41/107
See application file for complete search history.

(56) References Cited

U.S. PATENT DOCUMENTS

| | | | | |
|---|---|---|---|---|
| 7,262,544 | B2* | 8/2007 | Aoki et al. | 310/363 |
| 7,732,997 | B2* | 6/2010 | Ishikura et al. | 310/363 |
| 2002/0140320 | A1* | 10/2002 | Unno et al. | 310/328 |

FOREIGN PATENT DOCUMENTS

| | | |
|---|---|---|
| CN | 101051668 A | 10/2007 |
| JP | 2-081508 A | 3/1990 |
| JP | 10-200367 A | 7/1998 |

(Continued)

OTHER PUBLICATIONS

PCT/JP2011/060427 Written Opinion dated Aug. 2, 2011.

(Continued)

*Primary Examiner* — Thomas Dougherty
*Assistant Examiner* — Karen B Addison
(74) *Attorney, Agent, or Firm* — Arent Fox LLP

(57) ABSTRACT

A piezoelectric actuator that includes a piezoelectric substrate, first and second electrodes, and a conductive layer. The first and second electrodes are configured to apply a voltage to the piezoelectric substrate. The conductive layer is formed on the first electrode. The conductive layer is made of a metal or an alloy different in color from the second electrode.

17 Claims, 4 Drawing Sheets

(56) References Cited

FOREIGN PATENT DOCUMENTS

| | | | | |
|---|---|---|---|---|
| JP | 10-294501 | A | 11/1998 | |
| JP | 102945501 | * | 11/1998 | ............ H01L 41/09 |
| JP | 11-163668 | A | 6/1999 | |

OTHER PUBLICATIONS

PCT/JP2011/060427 International Search Report dated Aug. 2, 2011.

* cited by examiner

PIEZOELECTRIC ACTUATOR AND DRIVE DEVICE

CROSS REFERENCE TO RELATED APPLICATIONS

The present application is a continuation of International application No. PCT/JP2011/060427, filed Apr. 28, 2011, which claims priority to Japanese Patent Application No. 2010-113319, filed May 17, 2010, the entire contents of each of which are incorporated herein by reference.

FIELD OF THE INVENTION

The present invention relates to a piezoelectric actuator used, for example, for driving a magnetic head of a hard disk drive, and also relates to a drive device including the piezoelectric actuator.

BACKGROUND OF THE INVENTION

Conventionally, piezoelectric actuators have been widely used, for example, for driving a magnetic head of a hard disk drive.

A piezoelectric actuator includes a piezoelectric substrate polarized in a predetermined direction. Therefore, when mounted on a device, the piezoelectric actuator needs to be oriented in accordance with the direction of polarization. This means that the orientation of the piezoelectric actuator needs to be identifiable. For example, Patent Document 1 describes a piezoelectric actuator whose orientation is easily identifiable. Specifically, Patent Document 1 describes a piezoelectric actuator in which a silver chloride layer is formed on one of a pair of silver electrodes on opposite principal surfaces of a piezoelectric body which is made of piezoelectric ceramic. Since the silver chloride layer is different in color from the silver electrodes, the orientation of the piezoelectric actuator described in Patent Document 1 is easily identifiable.

Patent Document 1: Japanese Unexamined Patent Application Publication No. 10-294501

SUMMARY OF THE INVENTION

However, the silver chloride layer has a low conductivity. Therefore, for example, when electrical characteristics of the piezoelectric actuator are to be measured by connecting terminals of a measuring device to both the electrodes of the piezoelectric actuator, if the corresponding terminal of the measuring device is brought into contact with the silver chloride layer, the electrical characteristics of the piezoelectric actuator may not be able to be measured accurately. In particular, if the piezoelectric actuator is small in size, it is difficult to accurately bring the terminal of the measuring device into contact with only a portion of the electrode not having the silver chloride layer thereon. As a result, the accuracy in measuring the electrical characteristics of the piezoelectric actuator tends to be very low.

The present invention has been made in view of the points described above. An object of the present invention is to provide a piezoelectric actuator that allows easy identification of its orientation and also allows easy measurement of its electrical characteristics.

A first piezoelectric actuator according to the present invention includes a piezoelectric substrate, first and second electrodes, and a first conductive layer. The first and second electrodes are configured to apply a voltage to the piezoelectric substrate. The first conductive layer is formed on the first electrode. The first conductive layer is made of a metal or an alloy different in color from the second electrode.

A second piezoelectric actuator according to the present invention includes a piezoelectric substrate, first and second electrodes, and a first conductive layer. The first and second electrodes are configured to apply a voltage to the piezoelectric substrate. The first conductive layer is formed on a part of the first electrode. The first conductive layer is made of a metal or an alloy different in color from the first electrode.

In the present invention, the phrase "different in color" means that at least one of brightness, chroma, and hue is different.

In a specific aspect of each of the first and second piezoelectric actuators according to the present invention, the first conductive layer is lower in solder wettability than the first electrode. With this configuration, it is possible to suppress a short circuit between the first and second electrodes caused by spreading of solder. At the same time, it is possible to reduce restraint on displacement of the piezoelectric substrate, the restraint being caused by spread solder. Thus, a high driving efficiency can be achieved.

In another specific aspect of each of the first and second piezoelectric actuators according to the present invention, the piezoelectric substrate is formed in the shape of a rectangular parallelepiped having first and second principal surfaces, first and second side surfaces, and first and second end surfaces. The first and second principal surfaces each extend in a first direction and a second direction. The second direction is perpendicular to the first direction. The first and second side surfaces each extend in the first direction and a third direction. The third direction is perpendicular to both the first and second directions. The first and second end surfaces each extend in the second and third directions. The first electrode has a first portion and a second portion. The first portion of the first electrode is formed on the first principal surface other than an end portion on one side in the first direction. The second portion of the first electrode is formed on the first end surface. The second electrode has a first portion, a second portion, and a third portion. The first portion of the second electrode is formed on the second principal surface. The second portion of the second electrode is formed on the second end surface. The third portion of the second electrode is formed on the end portion of the first principal surface on the one side in the first direction, and is spaced from the first electrode. The first conductive layer extends from one end to the other end of the first portion of the first electrode in the second direction. With this configuration, where the first conductive layer is relatively large in size, the orientation of the piezoelectric actuator is more easily identifiable. Additionally, it is possible to more effectively suppress a short circuit between the first and second electrodes caused by spreading of solder. At the same time, it is possible to more effectively reduce restraint on displacement of the piezoelectric substrate, the restraint being caused by spread solder. Thus, a higher driving efficiency can be achieved.

In another specific aspect of each of the first and second piezoelectric actuators according to the present invention, the first conductive layer includes a plurality of conductive layers extending from one end to the other end of the first portion of the first electrode in the second direction, the plurality of conductive layers being arranged in the first direction. With this configuration, the orientation of the piezoelectric actuator is more easily identifiable. Additionally, it is possible to more effectively suppress a short circuit between the first and second electrodes caused by spreading of solder. At the same time, it is possible to more effectively reduce restraint on displacement of the piezoelectric substrate, the restraint being caused by spread solder. Thus, a higher driving efficiency can be achieved.

In still another specific aspect of each of the first and second piezoelectric actuators according to the present invention, the first and second electrodes are at least partially opposite each other, with the piezoelectric substrate interposed therebetween. The first conductive layer is formed to cover at least a part of a portion of the first electrode opposite the second electrode. With this configuration, the first conductive layer can protect the first electrode on an excitation part of the piezoelectric substrate, the excitation part being located between the first and second electrodes and configured to be excited when a voltage is applied between the first and second electrodes. Thus, it is possible to effectively suppress damage to the portion of the first electrode located on the excitation part.

In still another specific aspect of each of the first and second piezoelectric actuators according to the present invention, the first conductive layer has stiffness higher than that of the first electrode. With this configuration, it is possible to more effectively suppress damage to the portion of the first electrode located on the excitation part.

In still another specific aspect of each of the first and second piezoelectric actuators according to the present invention, the piezoelectric actuator further includes a second conductive layer formed on the second electrode, the second conductive layer being different in at least one of color and shape from the first conductive layer. With this configuration, it is possible to suppress damage to the second electrode.

In still another specific aspect of each of the first and second piezoelectric actuators according to the present invention, the first and second electrodes are at least partially opposite each other, with the piezoelectric substrate interposed therebetween. The second conductive layer is formed to cover at least a part of a portion of the second electrode opposite the first electrode. With this configuration, it is possible to suppress damage to a portion of the second electrode located on the excitation part.

In still another specific aspect of each of the first and second piezoelectric actuators according to the present invention, the second conductive layer has stiffness higher than that of the second electrode. With this configuration, it is possible to more effectively suppress damage to the portion of the second electrode located on the excitation part.

In still another specific aspect of each of the first and second piezoelectric actuators according to the present invention, the first conductive layer is made of a material different from that of the first and second electrodes.

In still another specific aspect of each of the first and second piezoelectric actuators according to the present invention, the first and second electrodes each are made of a metal selected from a group composed of Au, Pt, Al, Cu, Ni, and Cr, or are made of an alloy containing one or more metals selected from the group composed of Au, Pt, Al, Cu, Ni, and Cr. With this configuration, the electrode material is less likely to migrate as compared to the case where, for example, the first and second electrodes each are made of Ag or an alloy containing Ag. Therefore, it is possible to suppress a short circuit between the first and second electrodes.

In still another specific aspect of each of the first and second piezoelectric actuators according to the present invention, the first conductive layer is made of a metal selected from a group composed of Au, Pt, Al, Cu, Ni, and Cr, or is made of an alloy containing one or more metals selected from the group composed of Au, Pt, Al, Cu, Ni, and Cr. With this configuration, the electrode material is less likely to migrate as compared to the case where, for example, the first conductive layer is made of Ag or an alloy containing Ag. Therefore, it is possible to suppress a short circuit between the first and second electrodes.

In still another specific aspect of each of the first and second piezoelectric actuators according to the present invention, the first conductive layer is a film formed by thin-film deposition. With this configuration, the density and stiffness of the first conductive layer can be higher than those in the case where, for example, the first conductive layer is formed by application of conductive paste. Thus, it is possible to more effectively suppress damage to the first electrode.

In still another specific aspect of each of the first and second piezoelectric actuators according to the present invention, the piezoelectric substrate expands and contracts in a direction perpendicular to a direction of the voltage applied thereto by the first and second electrodes. That is, in this aspect, the piezoelectric actuator vibrates in d31 mode.

A drive device according to the present invention includes a piezoelectric actuator according to the present invention described above.

In the first piezoelectric actuator according to the present invention, the first conductive layer made of a metal or an alloy different in color from the second electrode is formed on the first electrode. This allows the orientation of the first electrode and the second electrode to be easily identified.

In the second piezoelectric actuator according to the present invention, the first conductive layer is formed on a part of the first electrode and is made of a metal or an alloy different in color from the first electrode. Thus, since the first conductive layer serves as a mark for identification of orientation, the orientation of the first electrode and the second electrode can be easily identified.

In each of the first and second piezoelectric actuators according to the present invention, the first conductive layer is made of a metal or an alloy, and thus has a conductivity higher than that of, for example, a layer of metal salt, such as a silver chloride layer. Therefore, even when a terminal of a measuring device for measuring electrical characteristics is in contact with the first conductive layer, an electric resistance between the terminal and the first electrode is not significantly different from that when the terminal is in direct contact with the first electrode. Thus, the electrical characteristics of the piezoelectric actuator can be measured with a high degree of accuracy.

DETAILED DESCRIPTION OF THE PREFERRED EMBODIMENTS

Preferred embodiments of the present invention will now be described using drive devices 1a to 1c illustrated in FIG. 1, FIG. 3, and FIG. 4 as examples. Note that the drive devices 1a to 1c are merely examples. The present invention is by no means limited to the drive devices 1a to 1c and a piezoelectric actuator 20 included in the drive devices 1a to 1c.

First Embodiment

Figure 1:
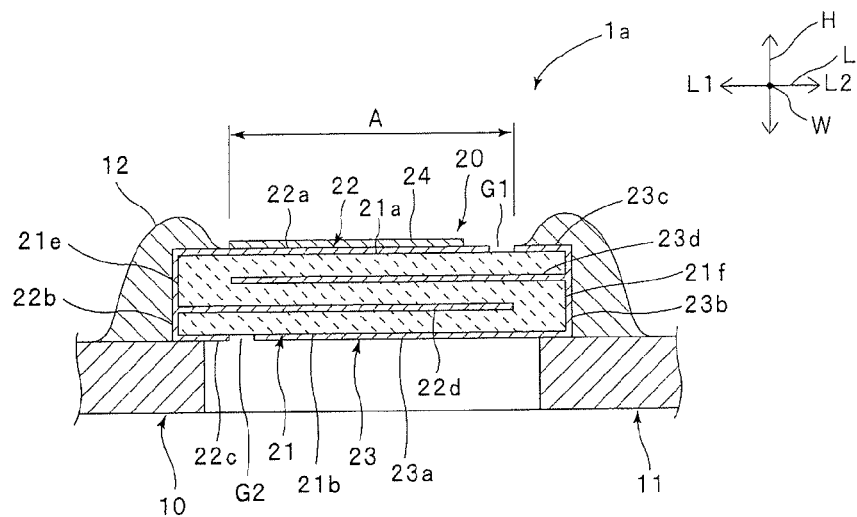
FIG. 1 is a schematic cross-sectional view of a drive device according to a first embodiment.
Figure 2:
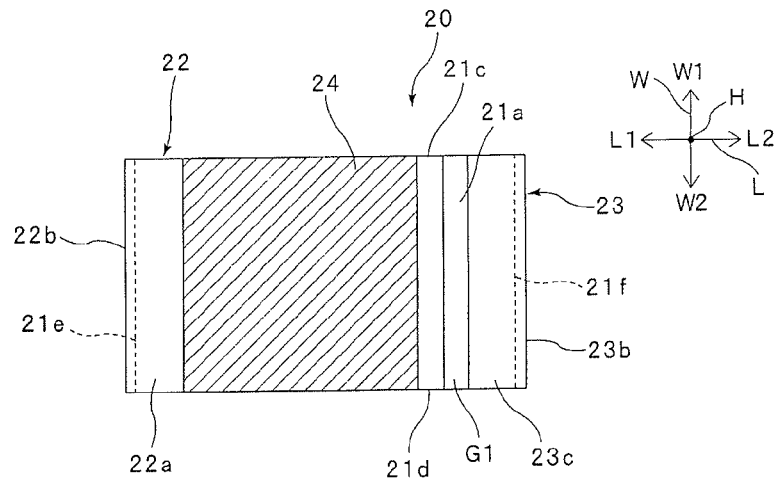
FIG. 2 is a schematic plan view of a piezoelectric actuator according to the first embodiment. For convenience of description, a conductive layer is indicated by hatching in FIG. 2.

FIG. 1 is a schematic cross-sectional view of a drive device according to a first embodiment. FIG. 2 is a schematic plan view of a piezoelectric actuator according to the first embodiment. For convenience of description, a conductive layer is indicated by hatching in FIG. 2.

The drive device 1a illustrated in FIG. 1 is designed to drive a magnetic head of a hard disk drive. The drive device 1a includes a fixed member 10 and a driven member 11 having the magnetic head. The fixed member 10 and the driven member 11 are connected to each other by a piezoelectric actuator 20. Therefore, when the piezoelectric actuator 20 is driven, the driven member 11 is displaced with respect to the fixed member 10. This drives the magnetic head attached to the driven member 11.

The fixed member 10 and the driven member 11 are not particularly limited. The fixed member 10 and the driven member 11 each may be formed, for example, by an insulating substrate that has a circuit internally or on the surface thereof.

The piezoelectric actuator 20 is bonded to the fixed member 10 and the driven member 11 with solder 12. For example, the solder 12 may contain Pb, or may be a so-called Pb-free solder that does not contain Pb.

The piezoelectric actuator 20 includes a piezoelectric substrate 21 made of appropriate piezoelectric material. For example, the piezoelectric substrate 21 may be made of piezoelectric ceramic, piezoelectric single crystal, piezoelectric resin, or piezoelectric composite containing resin in which piezoelectric particles are dispersed. Examples of the piezoelectric ceramic include lead zirconate titanate-based ceramic. Examples of the piezoelectric single crystal include quartz crystal. Examples of the piezoelectric resin include polyvinylidene fluoride.

In the present embodiment, the piezoelectric substrate 21 is in the shape of a rectangular parallelepiped. Dimensions of the piezoelectric substrate 21 are not particularly limited. For example, the piezoelectric substrate 21 may be about 0.01 mm to 0.2 mm in height, about 0.4 mm to 4.0 mm in length, and about 0.1 mm to 2.0 mm in width.

In the present invention, the term "rectangular parallelepiped" collectively refers to solids with three pairs of opposite faces. Therefore, for example, solids with chamfered or rounded edges and corners, and solids with opposite faces not strictly parallel to each other are also referred as rectangular parallelepipeds.

The piezoelectric substrate 21 has first and second principal surfaces 21a and 21b, first and second side surfaces 21c and 21d (see FIG. 2), and first and second end surfaces 21e and 21f. The first and second principal surfaces 21a and 21b each extend in a length direction L and a width direction W perpendicular to the length direction L. The first and second principal surfaces 21a and 21b are parallel to each other. The first and second side surfaces 21c and 21d each extend in the length direction L and a height direction H perpendicular to both the length direction L and the width direction W. The first and second side surfaces 21c and 21d are parallel to each other. The first and second end surfaces 21e and 21f each extend in the width direction W and the height direction H. The first and second end surfaces 21e and 21f are parallel to each other.

As illustrated in FIG. 1, the piezoelectric actuator 20 includes first and second electrodes 22 and 23 configured to apply a voltage to the piezoelectric substrate 21. The first and second electrodes 22 and 23 apply a voltage in the height direction H to the piezoelectric substrate 21. In the present embodiment, the piezoelectric substrate 21 is polarized in the height direction H, and expands and contracts in the length direction L. That is, the vibration mode of the piezoelectric actuator 20 according to the present embodiment is d31 mode. In the present invention, the vibration mode of the piezoelectric actuator is not limited to d31 mode and may be, for example, d33 mode.

The first electrode 22 includes first to fourth portions 22a to 22d. The first portion 22a is formed on the first principal surface 21a other than an end portion on one side L2 in the length direction L. The second portion 22b is formed on the first end surface 21e. The third portion 22c is formed on an end portion of the second principal surface 21b on the other side L1 in the length direction L. The first to third portions 22a to 22c are integrally provided. The fourth portion 22d inside the piezoelectric substrate 21 is parallel to the first and second principal surfaces 21a and 21b. The fourth portion 22d is connected to the second portion 22b.

The second electrode 23 includes first to fourth portions 23a to 23d. The first portion 23a is formed on the second principal surface 21b other than an end portion on the other side L1 in the length direction L. The first portion 23a is spaced from the third portion 22c of the first electrode 22. There is a gap G2 between the first portion 23a and the third portion 22c of the first electrode 22. The first portion 23a and the fourth portion 22d of the first electrode 22 are opposite each other in the height direction H. The second portion 23b is formed on the second end surface 21f. The third portion 23c is formed on an end portion of the first principal surface 21a on the one side L2 in the length direction L. The third portion 23c is spaced from the first portion 22a of the first electrode 22. There is a gap G1 between the third portion 23c and the first portion 22a of the first electrode 22. The first to third portions 23a to 23c are integrally provided. The fourth portion 23d is disposed inside the piezoelectric substrate 21. The fourth portion 23d is interposed between the first principal surface 21a and the fourth portion 22d of the first electrode 22 in the height direction H. The fourth portion 23d is opposite both the first portion 22a and the fourth portion 22d of the first electrode 22 in the height direction H. The fourth portion 23d is connected to the second portion 23b.

In the present embodiment, a part of the piezoelectric actuator 20 where the first electrode 22 and the second electrode 23 are opposite each other in the height direction H is an excitation part A. The excitation part A expands and contracts in response to application of a voltage.

The first and second electrodes 22 and 23 are not particularly limited as long as they have conductivity. For example, the first and second electrodes 22 and 23 each may be made of a metal selected from a group composed of Au, Pt, Al, Cu, Ni, Ti, Ag, and Cr, or may be made of an alloy containing one or more metals selected from the group composed of Au, Pt, Al, Cu, Ni, Ti, Ag, and Cr. Examples of the alloy containing one or more metals selected from the group composed of Au, Pt, Al, Cu, Ni, Ti, Ag, and Cr include an Ni/Cr alloy and an Ni/Cu alloy, such as Monel.

In particular, it is preferable that the first and second electrodes 22 and 23 each be made of a metal selected from a group composed of Au, Pt, Al, Cu, Ni, and Cr, or be made of an alloy containing one or more metals selected from the group composed of Au, Pt, Al, Cu, Ni, and Cr. This is because this can prevent easy occurrence of migration from the first and second electrodes 22 and 23 and thus can reduce occurrence of a short circuit between the first and second electrodes 22 and 23. To more effectively suppress the occurrence of migration, it is preferable that the first and second electrodes 22 and 23 each be made of a metal selected from a group composed of Au, Pt, Ni, and Cr, or be made of an alloy containing one or more metals selected from the group composed of Au, Pt, Ni, and Cr.

In the present embodiment, a conductive layer 24 is formed on the first electrode 22. Specifically, as illustrated in FIG. 2, the conductive layer 24 extends over the first portion 22a of the first electrode 22, from an end on one side W1 to an end on the other side W2 in the width direction W. A distance between the third portion 23c and an end of the conductive layer 24 adjacent to the third portion 23c is larger than a distance between the third portion 23c and an end of the first portion 22a of the first electrode 22 adjacent to the third portion 23c. In other words, the conductive layer 24 is more distant from a portion of the second electrode 23 located on the first principal surface 21a than the first portion 22a is.

The conductive layer 24 is formed to cover a portion of the first electrode 22 opposite the second electrode 23. That is, the conductive layer 24 is formed to cover at least a part of a portion of the first electrode 22 located within the excitation part A. More specifically, in the present embodiment, the conductive layer 24 is formed to cover substantially the entire portion of the first electrode 22 located within the excitation part A.

The thickness of the conductive layer 24 is not particularly limited, but may be, for example, about 0.01 µm to 0.5 µm. If the thickness of the conductive layer 24 is too large, the amount of displacement may be reduced or warpage may occur in the device. If the thickness of the conductive layer 24 is too small, it may be difficult to identify the orientation of the device.

In the present embodiment, the conductive layer 24 has stiffness higher than that of the first electrode 22. The conductive layer 24 is lower in solder wettability than the first electrode 22. In the present invention, the phrase "low in solder wettability" means that the strength of adhesion to an electrode is low. Solder wettability can be evaluated by performing tensile and shear tests on solder joints specified in JIS 3198-5. In the present invention, the term "stiffness" means thin-film hardness. Stiffness can be evaluated by scratch testing specified in ISO 20502.

The conductive layer 24 is made of a metal or an alloy different in color from the second electrode 23. Here, the phrase "different in color" means that at least one of chroma and brightness is different.

A method for making the color of the conductive layer 24 different from that of the second electrode 23 is not particularly limited. For example, as a method for making the color of the conductive layer 24 different from that of the second electrode 23, different materials may be used to form the conductive layer 24 and the second electrode 23.

For example, the conductive layer 24 may be made of a metal selected from a group composed of Au, Pt, Al, Cu, Ni, Ti, Ag, and Cr, or may be made of an alloy containing one or more metals selected from the group composed of Au, Pt, Al, Cu, Ni, Ti, Ag, and Cr. Examples of the alloy containing one or more metals selected from the group composed of Au, Pt, Al, Cu, Ni, Ti, Ag, and Cr include an Ni/Cr alloy and an Ni/Cu alloy, such as Monel.

In particular, it is preferable that the conductive layer 24 be made of a metal selected from a group composed of Au, Pt, Al, Cu, Ni, and Cr, or be made of an alloy containing one or more metals selected from the group composed of Au, Pt, Al, Cu, Ni, and Cr. This is because this can prevent easy occurrence of migration from the conductive layer 24 and thus can reduce occurrence of a short circuit between the first and second electrodes 22 and 23. To more effectively suppress the occurrence of migration, it is preferable that the conductive layer 24 be made of a metal selected from a group composed of Au, Pt, Ni, and Cr, or be made of an alloy containing one or more metals selected from the group composed of Au, Pt, Ni, and Cr.

Specifically, in the present embodiment, the conductive layer 24 is made of a material different from that of the first and second electrodes 22 and 23.

A method for forming the conductive layer 24 is not particularly limited. The conductive layer 24 may be formed by application of conductive paste, or may be formed by thin-film deposition. Examples of the thin-film deposition include vapor deposition, such as physical vapor deposition (sputtering) and chemical vapor deposition (CVD). In particular, it is preferable that the conductive layer 24 be formed by vapor deposition.

As described above, in the present embodiment, the conductive layer 24 different in color from the second electrode 23 is formed on the first electrode 22. Therefore, in the present embodiment, the orientation of the first electrode 22 and the second electrode 23 can be easily identified by determining the colors of the electrodes. In particular, in the present embodiment, the conductive layer 24 extends over a large area of the first portion 22a of the first electrode 22, from the end on the one side W1 to the end on the other side W2 in the width direction W. This makes it easier to identify the orientation of the first electrode 22 and the second electrode 23.

Also in the present embodiment, the conductive layer 24 different in color from the first electrode 22 is formed on a part of the first electrode 22. This allows the conductive layer 24 to serve as an identification mark. That is, by determining the presence of the conductive layer 24 serving as an identification mark, the orientation of the first electrode 22 and the second electrode 23 can be easily identified. Therefore, in the present embodiment, it is only necessary that the color of the conductive layer 24 be different from the color of one of the first and second electrodes 22 and 23. In this case, the color of the conductive layer 24 and that of the other of the first and second electrodes 22 and 23 may be either different or the same.

When the first and second electrodes 22 and 23 are the same in main component and similar (or the same) in color, the orientation of the piezoelectric actuator 20 tends not to be easily identifiable. Therefore, the technique of the present embodiment which provides the conductive layer 24 is particularly effective.

In the present embodiment, the conductive layer 24 is made of a metal or an alloy having an electric resistance lower than that of silver chloride or the like. Therefore, even when a terminal of a measuring device for measuring electrical characteristics is in contact with the conductive layer 24, an electric resistance between the terminal and the first electrode 22 is not significantly different from that when the terminal is in direct contact with the first electrode 22. Thus, the electrical characteristics of the piezoelectric actuator 20 can be measured with a high degree of accuracy.

In the present embodiment, the wettability of the conductive layer 24 with the solder 12 is lower than that of the first electrode 22 with the solder 12. Therefore, with the conductive layer 24, it is possible to suppress spreading of the solder 12 on the first electrode 22. Thus, the vibration of the piezoelectric actuator 20 is not easily restrained by the spread solder 12. A high driving efficiency can thus be achieved.

It is also possible to effectively suppress a short circuit between the first and second electrodes 22 and 23 caused by spreading of the solder 12.

The effect of suppressing the spreading of the solder 12 can be achieved regardless of the material of the first and second electrodes 22 and 23. The effect is particularly significant when the first and second electrodes 22 and 23 have high wettability with the solder 12. Specifically, the effect of suppressing the spreading of the solder 12 is particularly significant when the first and second electrodes 22 and 23 are made of a metal, such as Au, Ag, or Cu, or made of an alloy containing at least one of metals, such as Au, Ag, and Cu.

To more effectively suppress spreading of the solder 12, it is preferable, as in the present embodiment, that the conductive layer 24 extend from one end to the other end of the first portion 22a of the first electrode 22 in the width direction W.

In the present embodiment, the conductive layer 24 is formed to cover at least a part of a portion of the first electrode 22 located within the excitation part A. More specifically, in the present embodiment, the conductive layer 24 is formed to cover substantially the entire portion of the first electrode 22 located within the excitation part A. This allows the conductive layer 24 to also serve as a protective layer for protecting the excitation part A. It is thus possible to effectively suppress damage to a portion of the first electrode 22 located on the excitation part A caused, for example, by contact with other components during transport or mounting of the piezoelectric actuator 20, or by contact with a terminal during measurement. In the present embodiment, the conductive layer 24 is formed by thin-film deposition and is dense. The conductive layer 24 has stiffness higher than that of the first electrode 22. Therefore, it is possible to more effectively suppress damage to the portion of the first electrode 22 located on the excitation part A.

In the present embodiment, a preferable combination of the first and second electrodes 22 and 23 and the conductive layer 24 is, for example, a combination of the first and second electrodes 22 and 23 of. Au and the conductive layer 24 of Ni/Cr alloy. Since this combination inhibits oxidation of the surface of the first electrode 22, the solder wettability of the surface of the first electrode 22 does not degrade easily. Additionally, since a bonding strength between Au and Ni/Cr alloy is relatively high, the conductive layer 24 does not easily peel off the first electrode 22.

In the present embodiment, another preferable combination of the first and second electrodes 22 and 23 and the conductive layer 24 is, for example, a combination of the first and second electrodes 22 and 23 formed by lamination of Ni/Cr alloy and Au layers and the conductive layer 24 of Ni/Cr alloy. This combination can provide a relatively high bonding strength between the piezoelectric substrate 21 and the Au layers forming the surface layers of the first and second electrodes 22 and 23. Therefore, it is possible to suppress peeling of the first and second electrodes 22 and 23 off the piezoelectric substrate 21 caused by external stress etc. Moreover, since solder wettability of Ni/Cr alloy is poorer than that of Au layers, the conductive layer 24 of Ni/Cr alloy can effectively suppress spreading of the solder 12 over the Au layers. Thus, the excitation part A of the piezoelectric substrate 21 is not easily restrained by the spread solder 12.

Other preferred embodiments of the present invention and their modifications will now be described. In the following description, components having functions substantially the same as those of the first embodiment are referred to by common reference numerals, and their description will be omitted.

Second Embodiment

Figure 3:
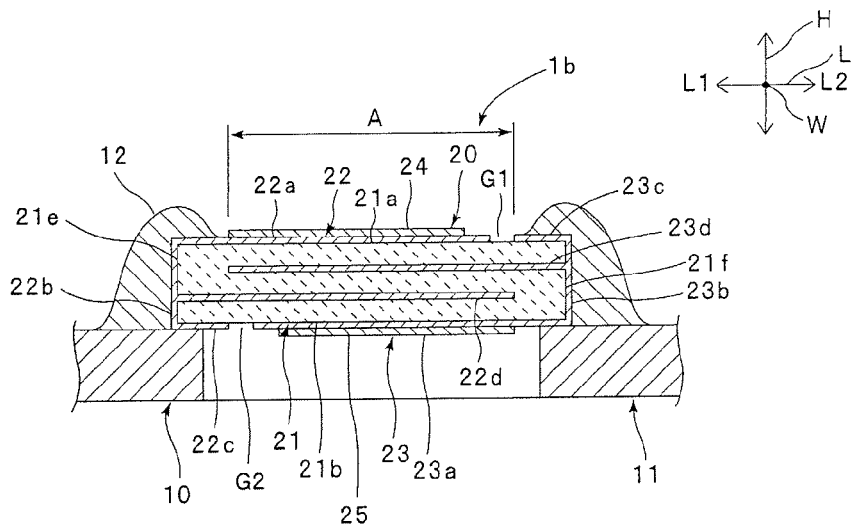
FIG. 3 is a schematic cross-sectional view of a drive device according to a second embodiment.

FIG. 3 is a schematic cross-sectional view of a drive device according to a second embodiment.

In the first embodiment described above, the conductive layer 24 is formed on the first electrode 22, whereas no conductive layer is formed on the second electrode 23. However, the present invention is not limited to this configuration.

For example, as illustrated in FIG. 3, in addition to the conductive layer 24 on the first electrode 22, a conductive layer 25 of metal or alloy may be formed on the second electrode 23. In this case, it is preferable that the conductive layer 25 be different in at least one of color and shape from the conductive layer 24. This makes it easier to identify the orientation of the piezoelectric actuator 20.

Like the conductive layer 24, the conductive layer 25 is made of a metal or an alloy having a high conductivity. Therefore, even with the conductive layer 25, it is possible to suppress a decrease in accuracy of measurement of electrical characteristics of the piezoelectric actuator 20.

In the present embodiment, the wettability of the conductive layer 25 with the solder 12 is lower than that of the second electrode 23 with the solder 12. Therefore, with the conductive layer 25, it is possible to suppress spreading of the solder 12 on the second electrode 23. Since both the conductive layer 24 and the conductive layer 25 are provided, the vibration of the piezoelectric actuator 20 is less likely to be easily restrained by the spread solder 12. A higher driving efficiency can thus be achieved.

Additionally, in the present embodiment, the conductive layer 25 extends over the first portion 23a of the second electrode 23 from one end to the other end in the width direction W. Therefore, it is possible to more effectively suppress spreading of the solder 12 over the second electrode 23. A higher driving efficiency can thus be achieved.

In the present embodiment, the conductive layer 25 is formed to cover at least a part of a portion of the second electrode 23 located within the excitation part A. More specifically, in the present embodiment, the conductive layer 25 is formed to cover substantially the entire portion of the second electrode 23 located within the excitation part A. This allows the conductive layer 25 to also serve as a protective layer for protecting the excitation part A. It is thus possible to effectively suppress damage to a portion of the second electrode 23 located on the excitation part A caused, for example, by contact with other components during transport or mounting of the piezoelectric actuator 20, or by contact with a terminal during measurement.

In the present embodiment, like the conductive layer 24, the conductive layer 25 is formed by thin-film deposition and is dense. The conductive layer 25 has stiffness higher than that of the second electrode 23. Therefore, it is possible to more effectively suppress damage to the portion of the second electrode 23 located on the excitation part A.

The conductive layer 25 may be made of a metal selected from a group composed of Au, Pt, Al, Cu, Ni, Ti, Ag, and Cr, or may be made of an alloy containing one or more metals selected from the group composed of Au, Pt, Al, Cu, Ni, Ti, Ag, and Cr.

In particular, it is preferable that the conductive layer 25 be made of a metal selected from a group composed of Au, Pt, Al, Cu, Ni, and Cr, or be made of an alloy containing one or more metals selected from the group composed of Au, Pt, Al, Cu, Ni, and Cr. This is because this can prevent easy occurrence of migration from the conductive layer 25 and thus can reduce occurrence of a short circuit between the first and second electrodes 22 and 23. To more effectively suppress the occurrence of migration, it is preferable that the conductive layer 25 be made of a metal selected from a group composed of Au, Pt, Ni, and Cr, or be made of an alloy containing one or more metals selected from the group composed of Au, Pt, Ni, and Cr.

Specifically, in the present embodiment, the conductive layer 25 is made of a material different from those of the first and second electrodes 22 and 23 and the conductive layer 24.

Third Embodiment

Figure 4:
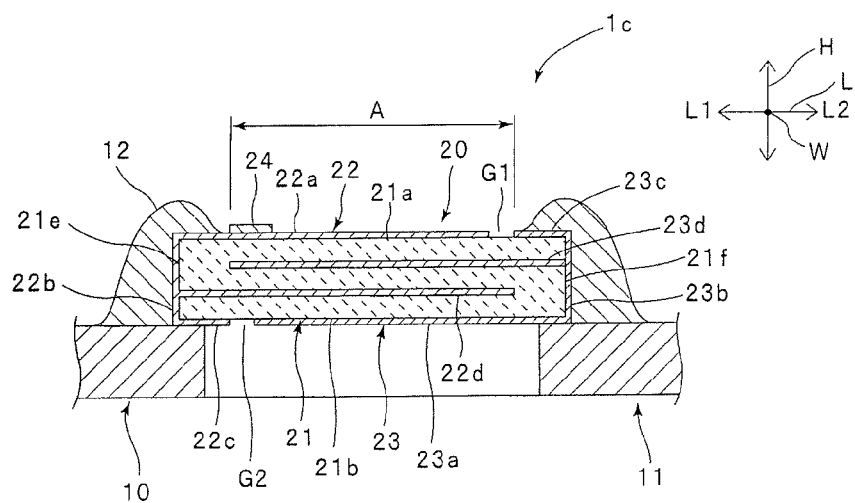
FIG. 4 is a schematic cross-sectional view of a drive device according to a third embodiment.
Figure 5:
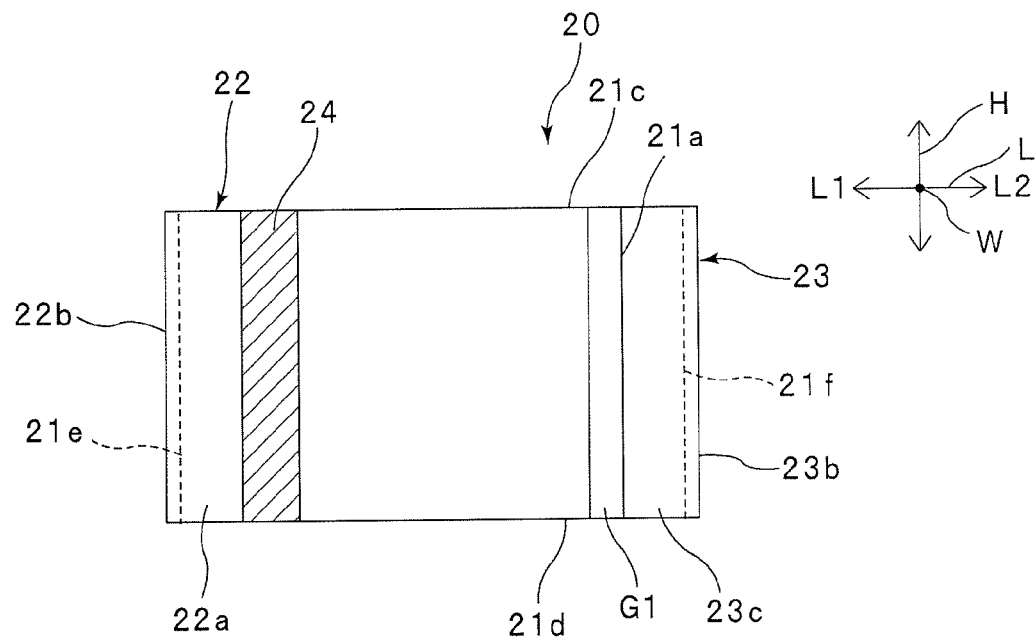
FIG. 5 is a schematic plan view of a piezoelectric actuator according to the third embodiment. For convenience of description, a conductive layer is indicated by hatching in FIG. 5.

FIG. 4 is a schematic cross-sectional view of a drive device according to a third embodiment. FIG. 5 is a schematic plan view of a piezoelectric actuator according to the third embodiment. For convenience of description, a conductive layer is indicated by hatching in FIG. 5.

In the first embodiment described above, the conductive layer 24 is formed to cover substantially the entire portion of the first electrode 22 located within the excitation part A. However, the present invention is not limited to this configuration. For example, as illustrated in FIG. 4 and FIG. 5, the conductive layer 24 may be formed linearly in the width direction W. Even with this configuration, it is possible, as in the first embodiment, to effectively suppress spreading of the solder 12 to the excitation part A.

(First to Third Modifications)

Figure 6:
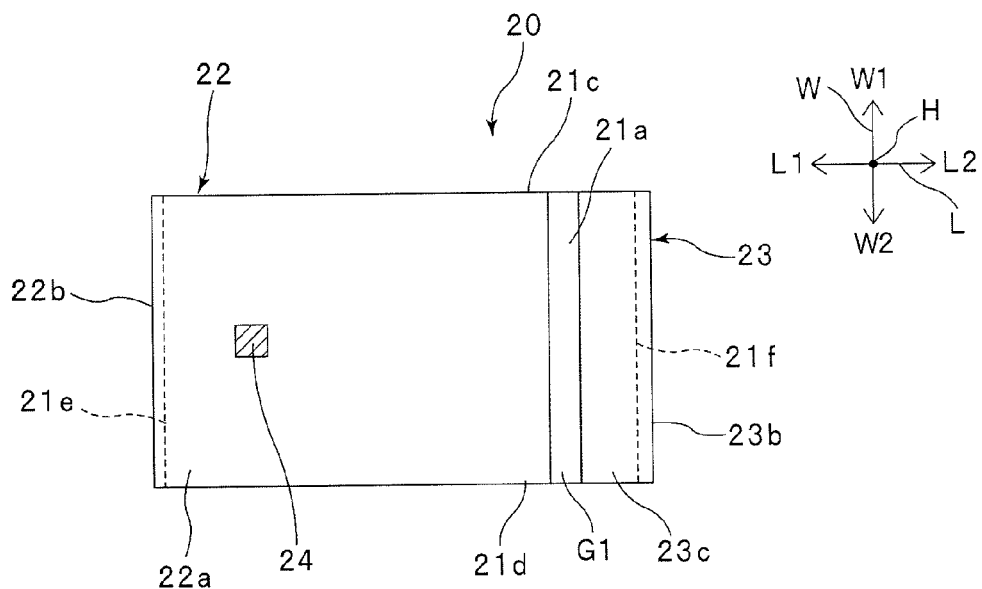
FIG. 6 is a schematic plan view of a piezoelectric actuator according to a first modification, and illustrates a formation pattern of a conductive layer. For convenience of description, the conductive layer is indicated by hatching in FIG. 6.
Figure 7:
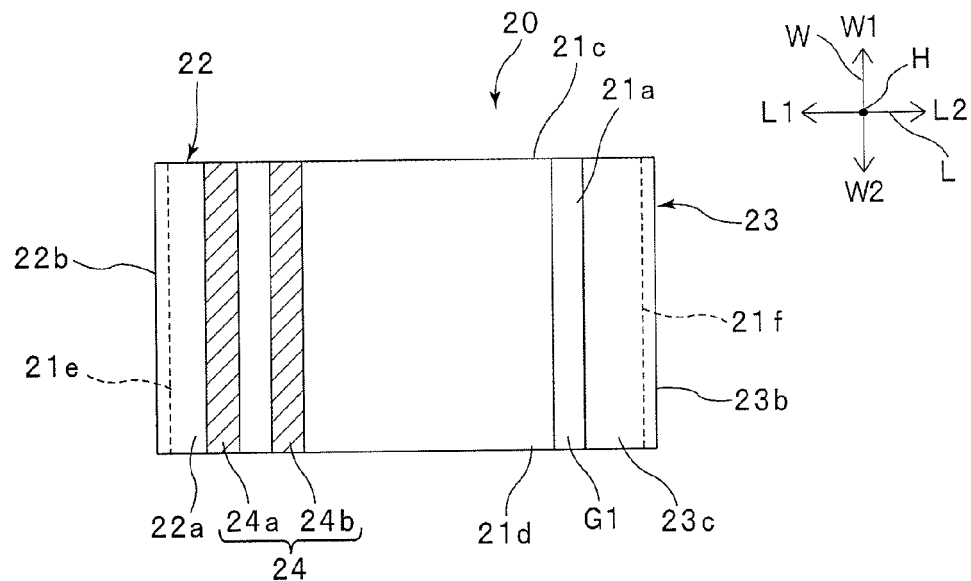
FIG. 7 is a schematic plan view of a piezoelectric actuator according to a second modification, and illustrates a formation pattern of a conductive layer. For convenience of description, the conductive layer is indicated by hatching in FIG. 7.
Figure 8:
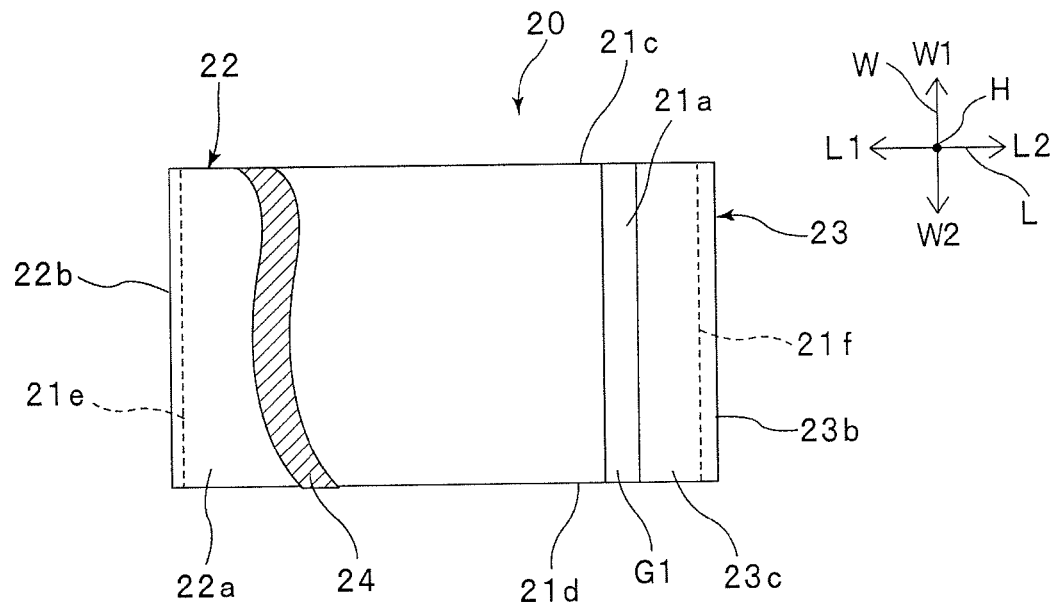
FIG. 8 is a schematic plan view of a piezoelectric actuator according to a third modification, and illustrates a formation pattern of a conductive layer. For convenience of description, the conductive layer is indicated by hatching in FIG. 8.

FIG. 6 is a schematic plan view of a piezoelectric actuator according to a first modification, and illustrates a formation pattern of a conductive layer. FIG. 7 is a schematic plan view of a piezoelectric actuator according to a second modification, and illustrates a formation pattern of a conductive layer. FIG. 8 is a schematic plan view of a piezoelectric actuator according to a third modification, and illustrates a formation pattern of a conductive layer. For convenience of description, the conductive layers are indicated by hatching in FIG. 6 to FIG. 8.

The shape of the conductive layer 24 is not limited to those described in the first to third embodiments. For example, as illustrated in FIG. 6, the conductive layer 24 may be formed in the shape of an island on a part of the first portion 22a of the first electrode 22 in both the width direction W and the length direction L.

As illustrated in FIG. 7, the conductive layer 24 may include a plurality of conductive layers 24a and 24b that extend from one end to the other end of the first portion 22a of the first electrode 22 in the width direction W and are arranged in the length direction L. In the present modification, the conductive layers 24a and 24b are parallel to the width direction W.

As illustrated in FIG. 8, the conductive layer 24 may be formed to be non-parallel to the width direction W. In the present modification, the conductive layer 24 is formed in the shape of a curved line.

Like the conductive layer 24, the conductive layer 25 of the second embodiment can be formed in various shapes, for example, as illustrated in FIG. 5 to FIG. 8.

Variations in the shapes of the conductive layers 24 and 25 are listed below. Note that the following variations are merely examples. It is obvious that various other shapes of conductive layers are possible.

(1) Only one of the conductive layer 24 and the conductive layer 25 is provided.

(2) Both the conductive layer 24 and the conductive layer 25 are provided.

(2-1) The conductive layer 24 and the conductive layer 25 are the same in shape and different in color.

(2-1-1) The conductive layer 24 and the conductive layer 25 are different in material.

(2-1-2) The conductive layer 24 and the conductive layer 25 are different in surface condition.

(2-2) The conductive layer 24 and the conductive layer 25 are different in shape and the same in color.

(2-3) The conductive layer 24 and the conductive layer 25 are different in both shape and color.

(Fourth Modification)

Figure 9:
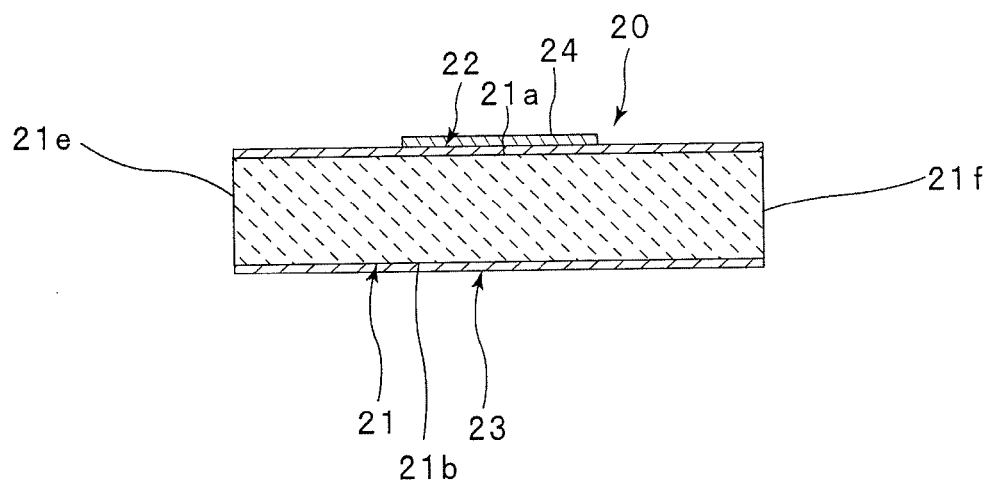
FIG. 9 is a schematic cross-sectional view of a piezoelectric actuator according to a fourth modification.

In the embodiments described above, the first and second electrodes 22 and 23 are partially formed inside the piezoelectric substrate 21. However, the present invention is not limited to this configuration. For example, as illustrated in FIG. 9, the first and second electrodes 22 and 23 may be formed only on the surfaces of the piezoelectric substrate 21.

REFERENCE SIGNS LIST 1a to 1c: drive device
10: fixed member
11: driven member
12: solder
20: piezoelectric actuator
21: piezoelectric substrate
21a: first principal surface of piezoelectric substrate
21b: second principal surface of piezoelectric substrate
21c: first side surface of piezoelectric substrate
21d: second side surface of piezoelectric substrate
21e: first end surface of piezoelectric substrate
21f: second end surface of piezoelectric substrate
22: first electrode
22a: first portion of first electrode
22b: second portion of first electrode
22c: third portion of first electrode
22d: fourth portion of first electrode
23: second electrode
23a: first portion of second electrode
23b: second portion of second electrode
23c: third portion of second electrode
23d: fourth portion of second electrode
24, 25, 24a, 24b: conductive layer
G1, G2: gap

The invention claimed is:

1. A piezoelectric actuator comprising:
a piezoelectric substrate;
first and second electrodes configured to apply a voltage to the piezoelectric substrate; and a first conductive layer on at least a part of the first electrode and made of a metal or an alloy different in color from at least one of the first electrode and the second electrode,
wherein the first conductive layer is lower in solder wettability than the first electrode.

2. The piezoelectric actuator according to claim 1, wherein the first conductive layer is made of a metal or an alloy different in color from the first electrode.

3. The piezoelectric actuator according to claim 1, wherein the first conductive layer is made of a metal or an alloy different in color from the second electrode.

4. The piezoelectric actuator according to claim 1, wherein the first conductive layer includes a plurality of conductive layers extending across the entire width of the first portion of the first electrode in the second direction, the plurality of conductive layers being arranged in the first direction.

5. The piezoelectric actuator according to claim 1, wherein the first and second electrodes are at least partially opposing each other, with the piezoelectric substrate interposed therebetween; and
the first conductive layer covers at least a part of a portion of the first electrode opposing the second electrode.

6. The piezoelectric actuator according to claim 5, wherein the second conductive layer has a stiffness higher than that of the second electrode.

7. The piezoelectric actuator according to claim 1, wherein the first conductive layer has a stiffness higher than that of the first electrode.

8. The piezoelectric actuator according to claim 1, wherein the first conductive layer is made of a material different from that of the first and second electrodes.

9. The piezoelectric actuator according to claim 1, wherein the first and second electrodes each are made of a metal selected from a group consisting of Au, Pt, Al, Cu, Ni, and Cr, or are made of an alloy containing one or more metals selected from the group consisting of Au, Pt, Al, Cu, Ni, and Cr.

10. The piezoelectric actuator according to claim 1, wherein the first conductive layer is made of a metal selected from a group consisting of Au, Pt, Al, Cu, Ni, and Cr, or is made of an alloy containing one or more metals selected from the group consisting of Au, Pt, Al, Cu, Ni, and Cr.

11. The piezoelectric actuator according to claim 1, wherein the first conductive layer is a film formed by a thin-film deposition process.

12. The piezoelectric actuator according to claim 1, wherein the piezoelectric substrate is configured to expand and contract in a direction perpendicular to a direction of the voltage applied thereto by the first and second electrodes.

13. A drive device comprising:
a fixed member;
a driven member; and a piezoelectric actuator according to claim 1 connected between the fixed member and the driven member.

14. A piezoelectric actuator comprising:
a piezoelectric substrate;
first and second electrodes configured to apply a voltage to the piezoelectric substrate; and
a first conductive layer on at least a part of the first electrode and made of a metal or an alloy different in color from at least one of the first electrode and the second electrode,
wherein the piezoelectric substrate is in the shape of a rectangular parallelepiped having first and second principal surfaces each extending in a first direction and a second direction perpendicular to the first direction, first and second side surfaces each extending in the first direction and a third direction perpendicular to both the first and second directions, and first and second end surfaces each extending in the second and third directions;
the first electrode has a first portion on the first principal surface other than a first end portion on a first side in the first direction thereof, and a second portion on the first end surface; and
the second electrode has a first portion on the second principal surface, a second portion on the second end surface, and a third portion on the first end portion of the first principal surface on the first side in the first direction, the third portion being spaced from the first electrode.

15. The piezoelectric actuator according to claim 14, wherein the first conductive layer extends across an entire width of the first portion of the first electrode in the second direction.

16. A piezoelectric actuator comprising:
a piezoelectric substrate;
first and second electrodes configured to apply a voltage to the piezoelectric substrate;
a first conductive layer on at least a part of the first electrode and made of a metal or an alloy different in color from at least one of the first electrode and the second electrode; and
a second conductive layer on the second electrode, the second conductive layer being different in at least one of color and shape from the first conductive layer.

17. The piezoelectric actuator according to claim 16, wherein the first and second electrodes are at least partially opposed to each other with the piezoelectric substrate interposed therebetween; and
the second conductive layer covers at least a part of a portion of the second electrode opposing the first electrode.

* * * * *